United States Patent
Zhu

(10) Patent No.: US 9,633,855 B2
(45) Date of Patent: Apr. 25, 2017

(54) PLANARIZATION PROCESS

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/722,022

(22) Filed: May 26, 2015

(65) Prior Publication Data
US 2015/0255293 A1  Sep. 10, 2015

Related U.S. Application Data

(63) Continuation of application No. PCT/CN2012/086765, filed on Dec. 17, 2012.

(30) Foreign Application Priority Data

Nov. 30, 2012 (CN) .......................... 2012 1 0505908

(51) Int. Cl.
*H01L 21/3205* (2006.01)
*H01L 21/4763* (2006.01)
(Continued)

(52) U.S. Cl.
CPC ........ *H01L 21/28017* (2013.01); *C23C 14/34* (2013.01); *H01L 21/31053* (2013.01); *H01L 21/31056* (2013.01); *H01L 21/31105* (2013.01); *H01L 21/31144* (2013.01); *H01L 21/3212* (2013.01); *H01L 21/32115* (2013.01);
(Continued)

(58) Field of Classification Search
CPC ......... H01L 21/31053; H01L 21/31056; H01L 21/31105
See application file for complete search history.

(56) References Cited

U.S. PATENT DOCUMENTS 5,416,048 A * 5/1995 Blalock ............. H01L 21/76838
204/192.32
5,721,172 A * 2/1998 Jang .................. H01L 21/76224
216/38
(Continued)

FOREIGN PATENT DOCUMENTS

CN          10155920 A      10/2009
CN         101924133 A      12/2010
(Continued)

OTHER PUBLICATIONS

English machine translation of IDS cited Chinese patent CN102543714.*
(Continued)

*Primary Examiner* — Savitr Mulpuri
*Assistant Examiner* — John M Parker
(74) *Attorney, Agent, or Firm* — Knobbe, Martens, Olson & Bear, LLP

(57) ABSTRACT

Planarization processing methods are disclosed. In one aspect, the method includes patterning a material layer and planarizing the patterned material layer by using sputtering. Due to the patterning of the material layer, the loading requirements of nonuniformity on a substrate for sputtering the material layer are reduced, compared with that before the patterning.

15 Claims, 10 Drawing Sheets

(51) Int. Cl.
*H01L 21/28* (2006.01)
*H01L 21/3105* (2006.01)
*H01L 21/311* (2006.01)
*H01L 21/321* (2006.01)
*H01L 21/3213* (2006.01)
*H01L 29/66* (2006.01)
*H01L 21/768* (2006.01)
*C23C 14/34* (2006.01)
*H01L 21/8234* (2006.01)

(52) U.S. Cl.
CPC .. *H01L 21/32131* (2013.01); *H01L 21/76819* (2013.01); *H01L 29/66545* (2013.01); *H01L 21/7684* (2013.01); *H01L 21/823456* (2013.01)

(56) References Cited

U.S. PATENT DOCUMENTS

| | | | |
|---|---|---|---|
| 5,885,900 A * | 3/1999 | Schwartz | H01L 21/3212 257/E21.244 |
| 6,280,644 B1 | 8/2001 | Martin et al. | |
| 6,395,620 B1 * | 5/2002 | Pan | H01L 21/76224 257/E21.246 |
| 6,436,806 B2 | 8/2002 | Lee | |
| 6,660,618 B1 * | 12/2003 | Chen | H01L 21/76802 257/E21.576 |
| 6,734,110 B1 | 5/2004 | Jang et al. | |
| 2005/0003668 A1 * | 1/2005 | Hung | H01L 21/31055 438/691 |
| 2009/0035902 A1 * | 2/2009 | Xu | H01L 21/823468 438/259 |
| 2009/0258502 A1 | 10/2009 | Bae et al. | |
| 2010/0258870 A1 | 10/2010 | Hsu et al. | |
| 2011/0014791 A1 * | 1/2011 | Johnson | H01L 21/823431 438/696 |

FOREIGN PATENT DOCUMENTS

| | | |
|---|---|---|
| CN | 102543714 A | 7/2012 |
| CN | 1477683 A | 2/2014 |
| JP | 8-56024 A | 2/1996 |
| JP | 9-102472 A | 4/1997 |

OTHER PUBLICATIONS

International Search Report and Written Opinion in International Application No. PCT/CN2012/086765, mailed on Sep. 5, 2013.
International Search Report for International Application No. PCT/CN2012/087003, mailed on Sep. 19, 2013.
Okano, K. et al. "Process Integration Technology and Device Characteristics of CMOS FinFET on Bulk Silicon Substrate with sub-10 nm Fin Width and 20 nm Gate Length." IEDM 2005, Dec. 5, 2005, pp. 721-724.

* cited by examiner

PLANARIZATION PROCESS

RELATED APPLICATIONS

This application claims priority to International Application No. PCT/CN2012/086765, filed on Dec. 17, 2012, entitled "PLANARIZATION PROCESSING METHOD," and Chinese application no. 201210505908.9, filed on Nov. 30, 2012, each of which is incorporated herein by reference in its entirety.

BACKGROUND

Field

The disclosed technology relates to semiconductor technology, and particularly to a method of planarizing a material layer formed on a substrate.

Description of the Related Technology

Planarization processes such as Chemical Mechanical Polishing (CMP) are used in semiconductor processing or manufacturing to obtain relatively planar surfaces. However, it may be difficult to control surface flatness of a material layer to within a tolerance, of, for example, several nanometers, particularly if a portion of the material layer needs to be grounded. Planarizing a surface within a desired tolerance may be difficult with existing methods when the material layer covers features of nonuniform lengths, widths, and/or heights. There is a need for systems and methods to consistently planarize material layers formed on substrates within desired tolerances, even if the material layer covers nonuniform features.

SUMMARY OF CERTAIN INVENTIVE ASPECTS

The disclosed technology includes a planarization process, by which it is possible to achieve a substantially uniform and relatively planar surface.

One aspect of the disclosed technology is a method of planarizing a material layer formed on a substrate. The method includes patterning the material layer. The method further includes planarizing the patterned material layer by sputtering, wherein the patterning of the material layer results in (enables that) a loading condition for the sputtering on the material layer having a lower non-uniformity across the substrate than that before the patterning.

BRIEF DESCRIPTION OF THE DRAWINGS

The above and other objects, features and advantages of the disclosed technology will become apparent from following description of embodiments when read in conjunction with the following drawings.

DETAILED DESCRIPTION OF CERTAIN EMBODIMENTS

Figure 1:
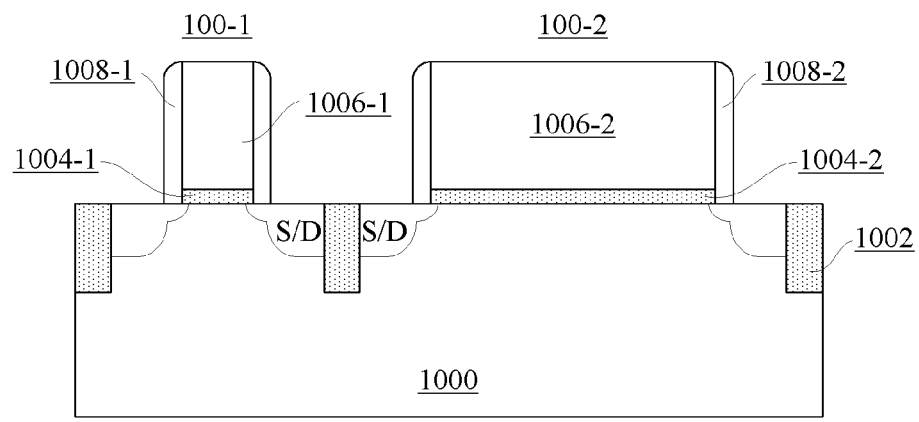
FIG. 1 is a cross sectional view during an intermediate step of a planarization process according to an embodiment of the disclosed technology.

Next, the disclosed technology will be described with reference to the drawings. These descriptions are provided for illustrative purpose, rather than limiting the disclosed technology. Further, descriptions of known structures and techniques are omitted so as not to obscure the concept of the disclosed technology.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the disclosed technology, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

In an embodiment of the disclosed technology, a material layer may be planarized by sputtering of Ar or N plasma. Due to such planarization by sputtering, instead of conventional planarization by CMP, it is possible to achieve a relatively flat surface of the material layer. The material layer may comprise a variety of material layers used in semiconductor manufacture processes, for example, including but not limited to, an insulator material layer, a semiconductor material layer and a conductive material layer.

Variations in the thickness or height of the material layer may correspond to different sputtering loads at different locations. For example, the material layer at a first location may be higher or thicker than at a second location. Therefore, more sputtering may be necessary at the first location than the second location for the two locations to be planarized to the same height. This corresponds to a loading effect in the sputtering due to nonuniformities, with a larger load at surface locations that need more sputtering, and a smaller load at locations that need less sputtering. The so-called "loading effect" means that the material layer may have its thickness and/or morphology and the like after the sputtering affected by a pattern present in the material layer as well as a density of the pattern (or morphology of the material layer) and the like Therefore, an embodiment may take the loading effect into account in the sputtering to obtain a relatively flat surface.

For example, if the material layer comprises a raised portion due to an underlying (raised) feature, an area where the raised portion is located may require "more" sputtering than another area where there is no raised portion, so that this area can be kept substantially flat with the other area. More sputtering may correspond to sputtering for a longer time period under the same sputtering parameters (for example, sputtering power and/or atmospheric pressure); or a greater sputtering intensity (for example, greater sputtering power and/or atmospheric pressure) for the same sputtering time period; or some combination of these two. In this example, the raised portion has a larger loading condition for the sputtering.

On the other hand, if the material layer comprises a recessed portion due to an underlying (recessed) feature, an area where the recessed portion is located may require "less" sputtering than another area where there is no recessed portion, so that this area may be kept substantially flat with the other area. That is, the recessed portion has a smaller loading condition for the sputtering.

Further, if there are a plurality of nonuniform or inconsistent features (for example, of differing length, width, or height), the material layer may have inconsistent bulges and/or recesses due to the features. Variable surface heights cause variable loading condition across the substrate. For example, for the bulges, the loading condition of a bulge with a larger size is higher than the loading condition of a bulge with a smaller size; for the recesses, the loading condition of a recess with a larger size is lower than the loading condition of a recess with a smaller size. Uniform sputtering or planarization across a surface with variable surface heights, and associated variable loading requirements, may result in nonuniform surfaces that may not meet required surface flatness tolerances.

In an embodiment, photolithography may be incorporated into the planarization process of the material layer by sputtering, so as to implement selective planarization. For example, before sputtering, the material layer may be patterned by photolithography. The loading condition for the sputtering to be performed may be taken into account in the patterning. Specifically, the material layer may be patterned in such a manner that the loading condition for the sputtering on the material layer has a lower non-uniformity across the substrate than that before the patterning. As such, the subsequent sputtering may be performed in a substantially uniform way across the substrate, which may facilitate to obtain a flat surface.

In an embodiment, the material layer may be patterned, so that the patterned material layer can exhibit a substantially uniform (local or global) distribution of the loading condition for the sputtering across the substrate. Specifically, the material layer may be patterned, so that there may be protrusions (locally or globally) distributed in a substantially uniform manner on the patterned material layer.

In an embodiment, the material layer may be patterned, so as to remove from the material layer a portion which has a relative high loading condition. For example, the bulge(s) of the material layer caused the underlying feature(s) may be removed.

The above described features may comprise various features capable of being formed on the substrate, including but not limited to, a raised feature, such as a gate and/or a fin, on the substrate, and/or a recessed feature, such as a gate trench formed by removing a sacrificial gate in a gate last process, on the substrate.

FIGS. 1-14 illustrate cross sectional views during intermediate steps of a method of planarizing a material layer formed on a substrate according to an embodiment of the disclosed technology. [0041] As shown in FIG. 1, a substrate 1000 may be provided. The substrate 1000 may comprise various forms of substrates, for example, a bulk semiconductor substrate such as a bulk Si substrate, a Semiconductor-on-Insulator (SOI) substrate, a SiGe substrate, or the like. In the following descriptions, the bulk Si substrate is described by way of example. Shallow trench isolation (STI) 1002 may be formed on the substrate 1000 to isolate active areas of respective devices. For example, the STI 1002 may comprise oxides such as silicon oxide.

(Sacrificial) gate stacks 100-1 and 100-2 may be formed on the substrate 1000. The gate stack 100-1 may comprise a sacrificial gate dielectric layer 1004-1 and a sacrificial gate conductor layer 1006-1 sequentially formed on the substrate 1000, and a gate spacer 1008-1 formed on side walls of the sacrificial gate dielectric layer 1004-1 and the sacrificial gate conductor layer 1006-1. Similarly, the gate stack 100-2 may comprise a sacrificial gate dielectric layer 1004-2 and a sacrificial gate conductor layer 1006-2 sequentially formed on the substrate 1000, and a gate spacer 1008-2 formed on side walls of the sacrificial gate dielectric layer 1004-2 and the sacrificial gate conductor layer 1006-2. For example, the sacrificial gate dielectric layers 1004-1 and 1004-2 may comprise oxide such as silicon oxide, the sacrificial gate conductor layers 1006-1 and 1006-2 may comprise polysilicon, and the gate spacers 1008-1 and 1008-2 may comprise nitride such as silicon nitride. Further, source/drain regions S/D of the devices may be formed at opposite sides of the respective gate stacks 100-1 and 100-2 in the substrate 1000 by, for example, ion implantation. There are various ways in the art to form the gate stacks and the S/D regions.

In the example as shown in FIG. 1, in order to obtain the devices with different driving capacities, the gate stacks 100-1 and 100-2 may have their respective gate lengths nonuniform (inconsistent). For example, the gate length of the gate stack 100-2 is larger than that of the gate stack 100-1.

The disclosed technology is not limited to a specific number of the gate stacks, although two gate stacks are shown in the example of FIG. 1. For example, there may be 1, 2, 3, 4, 5, 6, 7, 8, 9, 10 or more gate stacks. Further, in the example of FIG. 1, a gate-last process using the sacrificial gate stacks is described. However, the disclosed technology is also applicable to a gate-first process.

Figure 2:
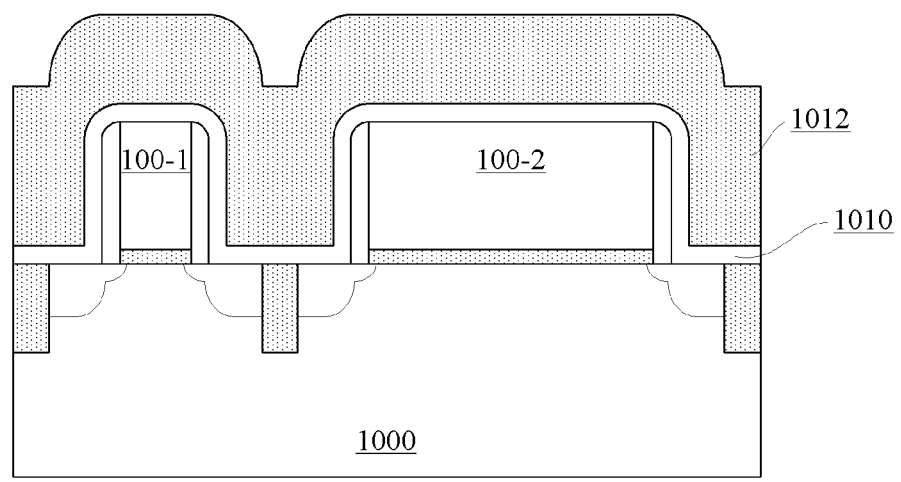
FIG. 2 is a cross sectional view during an intermediate step of a planarization process according to an embodiment of the disclosed technology.

FIG. 2 is a cross sectional view during an intermediate step of a planarization process according to an embodiment of the disclosed technology. As shown in FIG. 2, an interlayer dielectric (ILD) layer 1012 may be formed on the substrate by, for example, deposition. For example, the ILD layer 1012 may comprise oxide, with a thickness sufficient to cover the gate stacks 100-1, 100-2. A nitride liner layer 1010 may be deposited before depositing the oxide ILD layer 1012. The nitride layer 1010 may have a thickness of about 5-50 nm.

As shown in FIG. 2, the ILD layer 1012 has its top surface rugged (of variable height) due to the presence of the gate stacks 100-1 and 100-2. Due to this, the ILD layer 1012 needs to be planarized. According to an embodiment of the disclosed technology, the ILD layer 1012 may be patterned before the planarization, so as to reduce the non-uniformity of the loading condition for the subsequent planarization (for example, sputtering) across the substrate.

Figure 3:
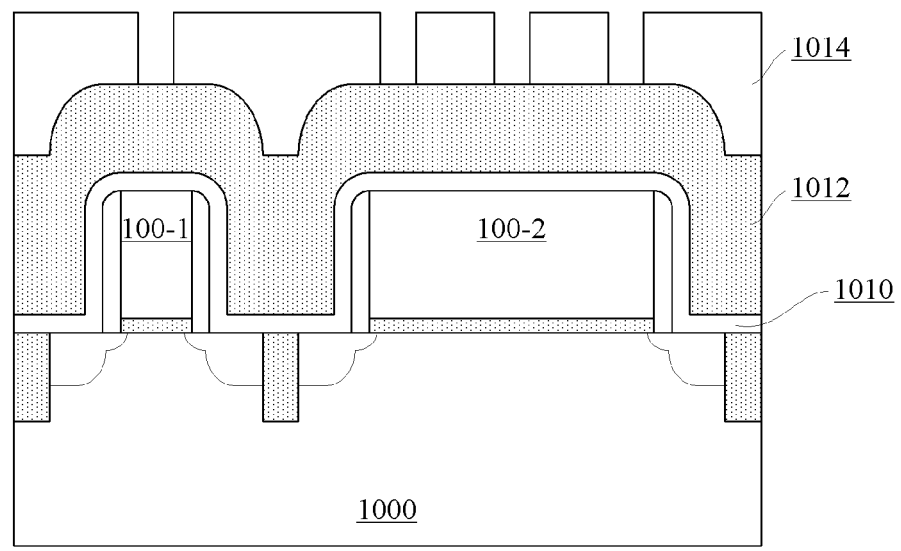
FIG. 3 is a cross sectional view during an intermediate step of a planarization process according to an embodiment of the disclosed technology.

FIG. 3 is a cross sectional view during an intermediate step of a planarization process according to an embodiment of the disclosed technology. FIG. 3 illustrates that photoresist 1014 may be coated on the ILD layer 1012, and then patterned by operations such as exposure via a mask and development. The loading condition for the subsequent sputtering is taken into account in patterning the photoresist 1014. Specifically, in the example as shown in FIG. 3, the photoresist 1014 is patterned so that there are protrusions distributed in a substantially uniform manner on the ILD layer 1012 after being patterned with the patterned photoresist 1014 as a mask. For example, a first mask for exposing the photoresist 1014 may be designed according to a second mask for forming the gate stacks 100-1 and 100-2, which determines locations, shapes or the like of the gate stacks 100-1 and 100-2, and thus partially determines fluctuations of the ILD layer 1012.

Figure 4:
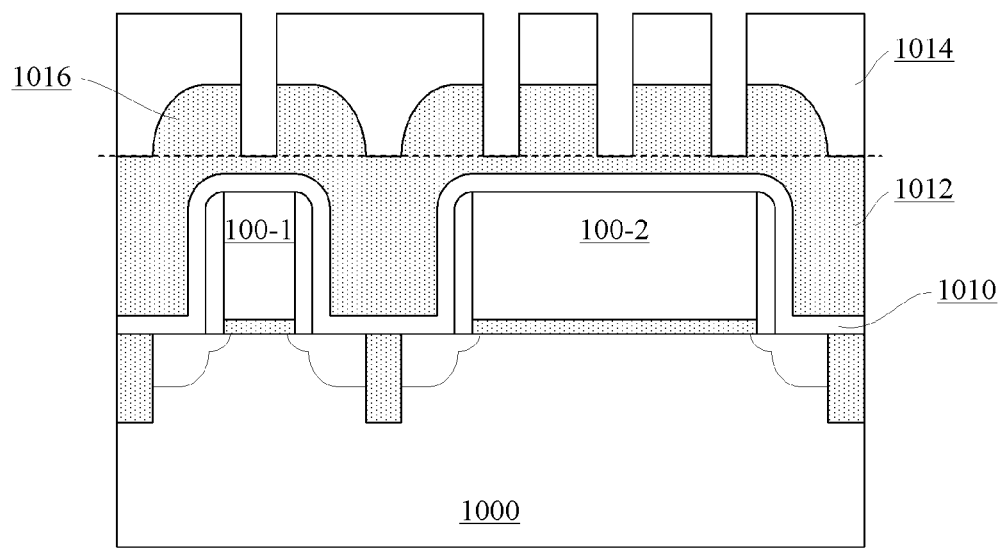
FIG. 4 is a cross sectional view during an intermediate step of a planarization process according to an embodiment of the disclosed technology.

FIG. 4 is a cross sectional view during an intermediate step of a planarization process according to an embodiment of the disclosed technology. FIG. 4 shows that the ILD layer 1012 is patterned by, for example, reactive-ion etching (RIE) with the patterned photoresist 1014 as a mask. Here, the patterning of the ILD layer 1012 may be controlled, so as to be stopped near the substantially lowest portion of the top surface of the ILD layer 1012 (a surface as shown by the dotted line in FIG. 4). In an embodiment, this corresponds to a height within a range of 50 nm above or below the lowest portion of the surface. The lowest portion of the surface of the ILD layer 1012 may be determined according to, for example, the thickness of the deposited ILD layer 1012. Further, the stop point for the patterning of the ILD layer 1012 may be determined according to a process parameter such as an etching rate of RIE. Then, the photoresist 1014 may be removed.

As such, a plurality of protrusions 1016 may be formed on the ILD layer 1012. In an embodiment, the plurality of protrusions 1016 may be distributed substantially uniformly across the substrate (for example, with similar dimensions and/or similar intervals).

Figure 5:
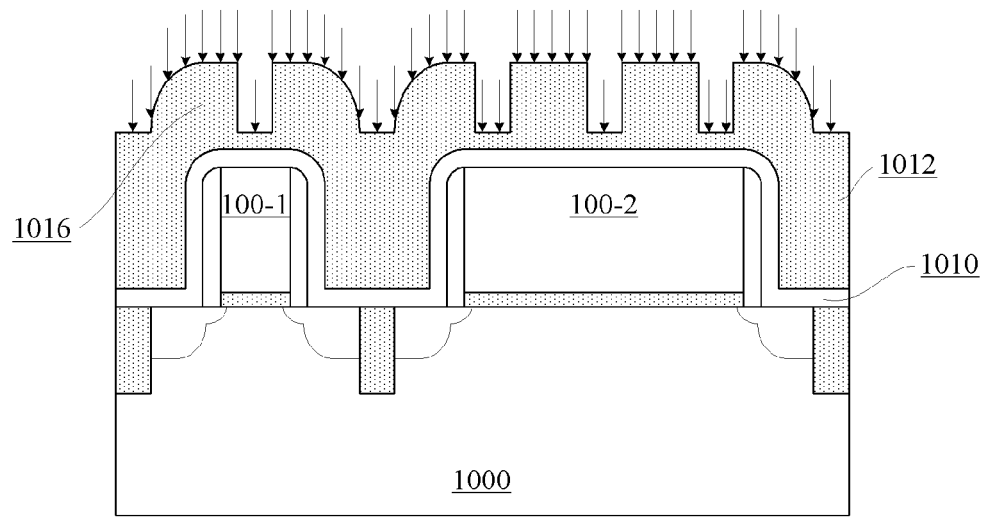
FIG. 5 is a cross sectional view during an intermediate step of a planarization process according to an embodiment of the disclosed technology.

FIG. 5 is a cross sectional view during an intermediate step of a planarization process according to an embodiment of the disclosed technology. The ILD layer 1012 of FIG. 5 may be subjected to sputtering so as to be planarized. For example, the plasma such as Ar or N plasma may be used for sputtering. Here, sputtering parameters, such as sputtering power and atmospheric pressure, may be controlled according to a cutting rate of the plasma sputtering on the ILD layer 1012, so as to determine a time period for the plasma sputtering. Thus, the plasma sputtering can be performed for a certain time period so as to sufficiently smooth the surface of the ILD layer 1012. Since the protrusions 1016 are distributed substantially uniformly across the substrate as described above, the loading condition for the sputtering may also have a substantially uniform distribution across the substrate in the sputtering. Therefore, the sputtering can be performed in a substantially uniform way, resulting in a relatively flatter surface.

Figure 6:
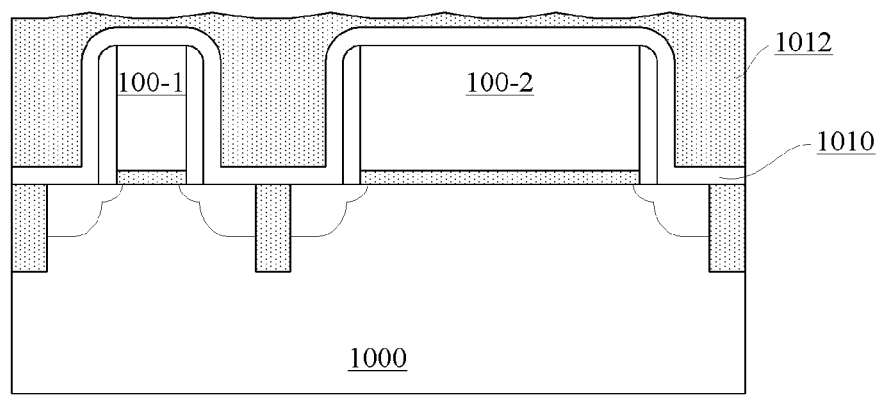
FIG. 6 is a cross sectional view during an intermediate step of a planarization process according to an embodiment of the disclosed technology.

FIG. 6 is a cross sectional view during an intermediate step of a planarization process according to an embodiment of the disclosed technology. FIG. 6 shows a result after planarization by sputtering. Although FIG. 6 shows microscopic fluctuations, the surface of the ILD layer 1012 has a sufficient flatness (is within a flatness tolerance), with fluctuations thereof controlled within several nanometers. In the example as shown in FIG. 6, the plasma sputtering may be stopped before reaching top surfaces of the gate stacks 100-1 and 100-2, so as to avoid damaging the gate stacks. In an embodiment of the disclosed technology, CMP may also be performed at a low dose as required on the ILD layer 1012 after planarization by sputtering.

Figure 7:
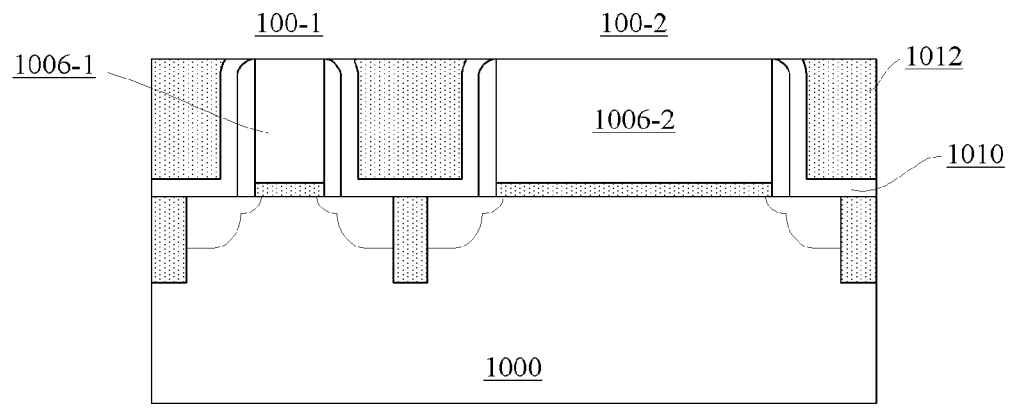
FIG. 7 is a cross sectional view during an intermediate step of a planarization process according to an embodiment of the disclosed technology.

FIG. 7 is a cross sectional view during an intermediate step of a planarization process according to an embodiment of the disclosed technology. After the surface of the ILD layer 1012 is sufficiently smoothed by the plasma sputtering, the ILD layer 1012 may be etched back by, for example, RIE, and the nitride liner layer 1010 (if any) may be also etched back, so as to expose the gate stacks 100-1 and 100-2 (specifically, to expose the sacrificial gate conductors 1006-1 and 1006-2), as shown in FIG. 7. Since the surface of the ILD layer 1012 becomes smooth by sputtering before the back-etching, the surface of the ILD layer 1012 may keep substantially flat across the substrate after the back-etching.

After the flat ILD layer 1012 is formed as discussed above, the gate replacement process may be performed to form a real gate stack of a final semiconductor device. Hereinafter, an example of the gate replacement process will be described. However, it should be noted that the disclosed technology is not limited to particular implementations of the gate replacement process.

Figure 8:
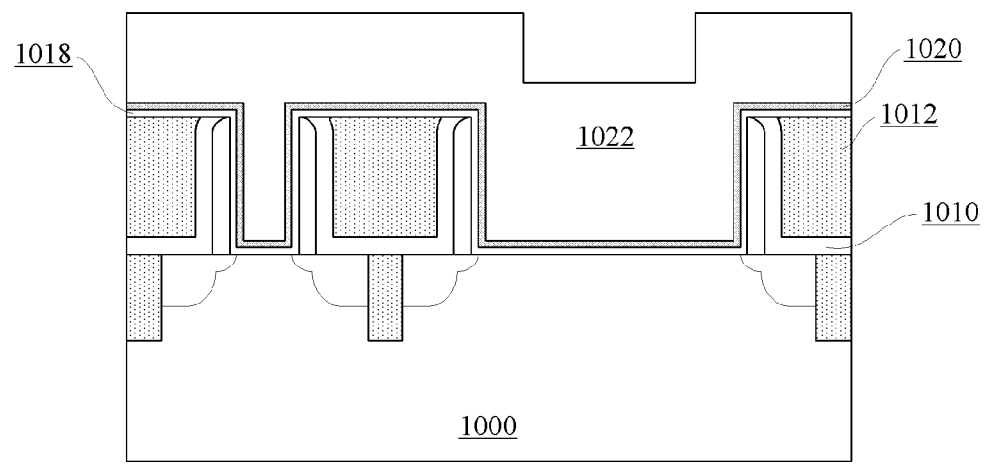
FIG. 8 is a cross sectional view during an intermediate step of a planarization process according to an embodiment of the disclosed technology.

FIG. 8 is a cross sectional view during an intermediate step of a planarization process according to an embodiment of the disclosed technology. In FIG. 8, the sacrificial gate conductor layers 1006-1, 1006-2 and the sacrificial gate dielectric layers 1004-1, 1004-2 may be selectively removed by, for example, RIE, leaving gate trenches inside the respective gate spacers 1008-1, 1008-2. The gate stacks may be formed by filling the respective gate trenches with a gate dielectric layer and a gate conductor layer. For example, the gate dielectric layer 1018 and the gate conductor layer 1022 may be formed sequentially by deposition. The gate dielectric layer 1018 may comprise a high-K gate dielectric such as HfO2, with a thickness of about 2-5 nm. The gate conductor layer 1022 may comprise a metal gate conductor such as W, with a thickness large enough to fill up the gate trench. Preferably, a work function adjustment layer 1020 may be formed between the gate dielectric layer 1018 and the gate conductor layer 1022. The work function adjustment layer 1020 may comprise, for example, TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, HfRu, RuOx, or any combination thereof, with a thickness of about 2-10 nm. A thin interface layer (not shown) may be deposited before the formation of the gate dielectric layer 1018. For example, the interface layer may comprise oxide (such as silicon oxide) with a thickness of about 0.2-1.2 nm.

In the example as shown in FIG. 8, because the gate trench formed due to the removal of the sacrificial gate stack 100-1 is smaller (specifically, in the gate length), there is no apparent recess in a portion of the gate conductor layer 1022 formed on this gate trench.

Figure 9:
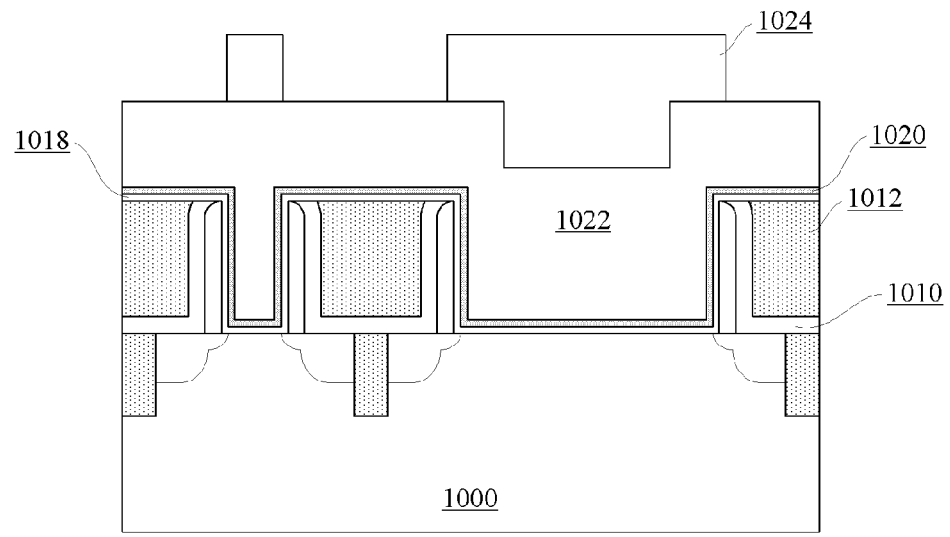
FIG. 9 is a cross sectional view during an intermediate step of a planarization process according to an embodiment of the disclosed technology.

FIG. 9 is a cross sectional view during an intermediate step of a planarization process according to an embodiment of the disclosed technology. Here, the gate conductor layer 1022 may also be planarized by the technique according to the disclosed technology. Specifically, as shown in FIG. 9, patterned photoresist 1024 may be formed on the gate conductor layer 1022. As described above, the photoresist 1024 may be patterned, so that there are protrusions distributed in a substantially uniform manner on the gate conductor layer 1022 after being patterned with the patterned photoresist 1024 as a mask. For example, a mask for exposing the photoresist 1024 may be designed according to the mask for forming the gate stacks 100-1, 100-2 (which determines locations, shapes, or the like of the gate stacks 100-1 and 100-2 so as to determine the locations of the gate trenches, and thus partially determines the fluctuations of the gate conductor layer 1022).

Figure 10:
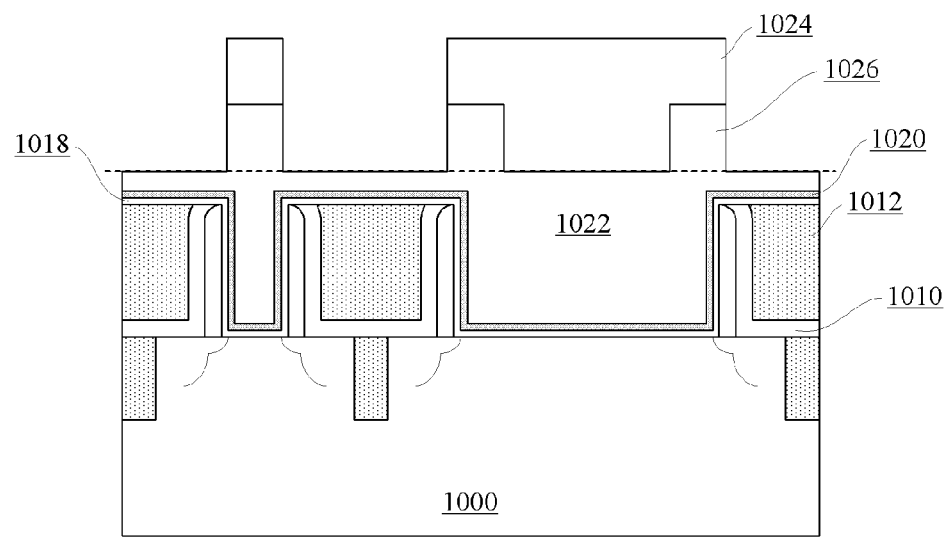
FIG. 10 is a cross sectional view during an intermediate step of a planarization process according to an embodiment of the disclosed technology.

FIG. 10 is a cross sectional view during an intermediate step of a planarization process according to an embodiment of the disclosed technology. Subsequently, as shown in FIG. 10, the gate conductor layer 1022 is patterned by, for example, RIE with the patterned photoresist 1024 as a mask. Here, the patterning of the gate conductor layer 1022 may be controlled, so as to be stopped substantially near a portion of the top surface of the gate conductor layer 1022 which is located at the middle of the relatively wider gate trench (a surface as shown by dotted line in FIG. 10), for example, at a height within a range of 50 nm above or below this portion of the top surface. The portion of the top surface of the gate conductor layer 1022 which is located at the middle of the relatively wider gate trench may be determined according to, for example, the thickness of the deposited gate conductor layer 1022. Further, the stop point for the patterning of the gate conductor layer 1022 may be determined according to a process parameter such as an etching rate of RIE. Then, the photoresist 1024 may be removed.

As such, a plurality of protrusions 1026 may be formed on the gate conductor layer 1022. In an embodiment, the plurality of protrusions 1026 may be distributed substantially uniformly across the substrate (for example, with similar dimensions and/or similar intervals).

Figure 11:
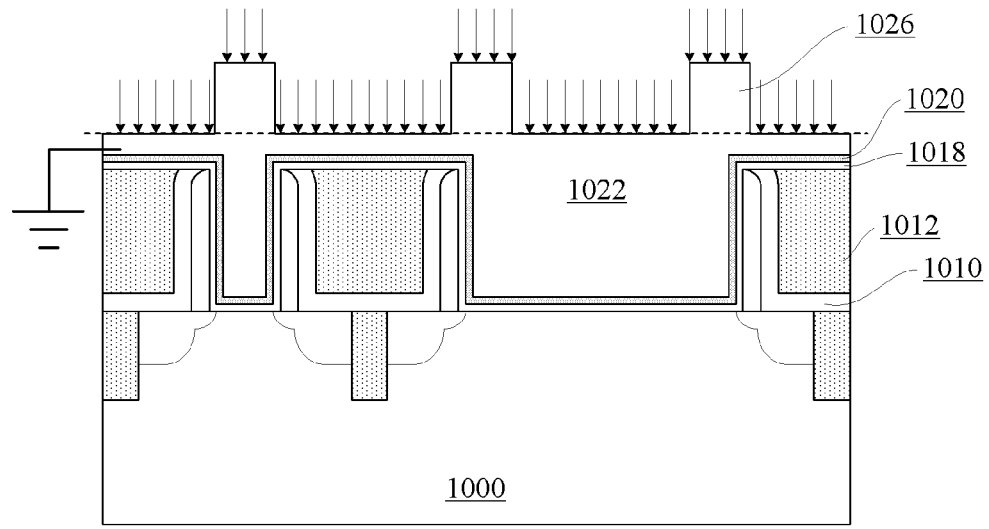
FIG. 11 is a cross sectional view during an intermediate step of a planarization process according to an embodiment of the disclosed technology.

FIG. 11 is a cross sectional view during an intermediate step of a planarization process according to an embodiment of the disclosed technology. Then, as shown in FIG. 11, the gate conductor layer 1022 may be subjected to sputtering so as to be planarized. For example, plasma such as Ar or N plasma may be used for sputtering. Here, sputtering parameters, such as sputtering power and atmospheric pressure, may be controlled according to a cutting rate of the plasma sputtering on the gate conductor layer 1022, so as to determine a time period for the plasma sputtering. Thus, the plasma sputtering can be performed for a certain time period so as to sufficiently smooth the surface of the gate conductor layer 1022. Since the protrusions 1026 are distributed substantially uniformly across the substrate as described above, the loading condition for the sputtering may also have a substantially uniform distribution across the substrate in the sputtering. Therefore, the sputtering can be performed in a substantially uniform way, resulting in a relatively flatter surface.

Figure 12:
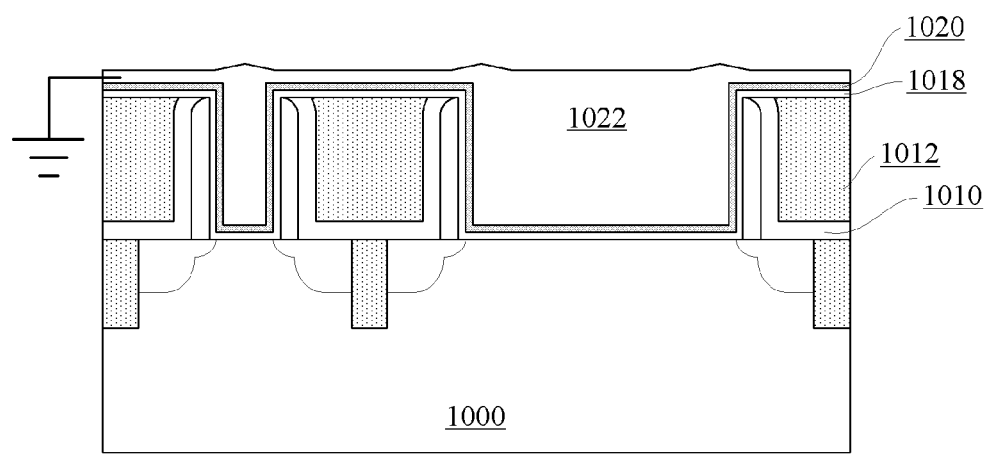
FIG. 12 is a cross sectional view during an intermediate step of a planarization process according to an embodiment of the disclosed technology.

FIG. 12 is a cross sectional view during an intermediate step of a planarization process according to an embodiment of the disclosed technology. FIG. 12 shows a result after planarization by sputtering. Although FIG. 12 shows microscopic fluctuations, the surface of the gate conductor layer 1022 has a sufficient flatness (falls within a flatness tolerance), with fluctuations controlled within several nanometers. According to another embodiment of the disclosed technology, CMP may also be performed at a low dose as required on the gate conductor layer 1022 after planarization by sputtering.

In the sputtering, the gate conductor layer 1022 may be grounded to avoid the plasma from damaging the gate dielectric layer. In order for the gate conductor of each of the gate stacks to be grounded during the sputtering process, the gate conductor layer 1022 for the respective gate stacks is not disconnected during the sputtering process, but is kept continuous at the end of the sputtering (as shown in FIG. 12, there is still a thin film of the gate conductor layer 1022 left on the work function adjustment layer 1020). Therefore, the whole gate conductor layer 1022 may be grounded throughout the sputtering process.

Figure 13:
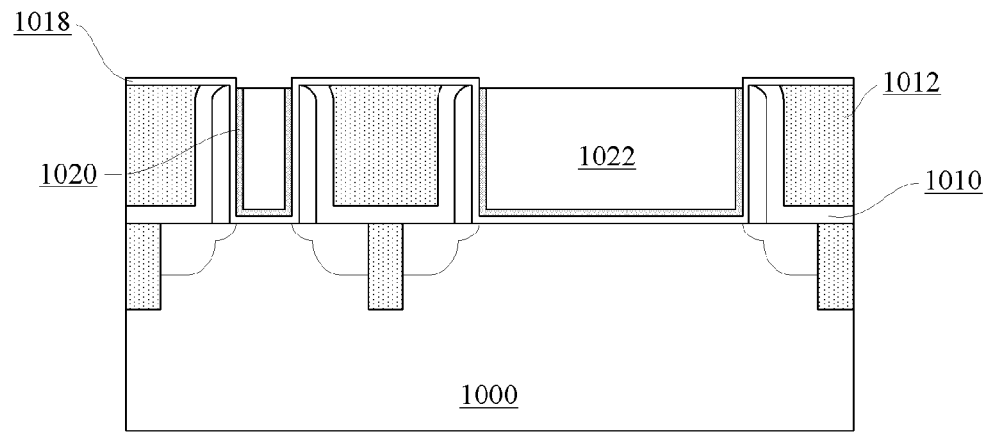
FIG. 13 is a cross sectional view during an intermediate step of a planarization process according to an embodiment of the disclosed technology.

FIG. 13 is a cross sectional view during an intermediate step of a planarization process according to an embodiment of the disclosed technology. After the surface of the gate conductor layer 1022 is sufficiently smoothed by the plasma sputtering, as shown in FIG. 13, the gate conductor layer 1022 may be etched back by, for example, RIE, and the work function adjustment layer 1020 (if any) may be also etched back, so that they are located within the gate trench. Alternatively, the gate dielectric layer 1018 may also be etched back. Since the surface of the gate conductor layer 1022 becomes smooth by sputtering before the back-etching, the surface of the gate conductor layer 1022 may keep substantially flat across the substrate after the back-etching.

Figure 14:
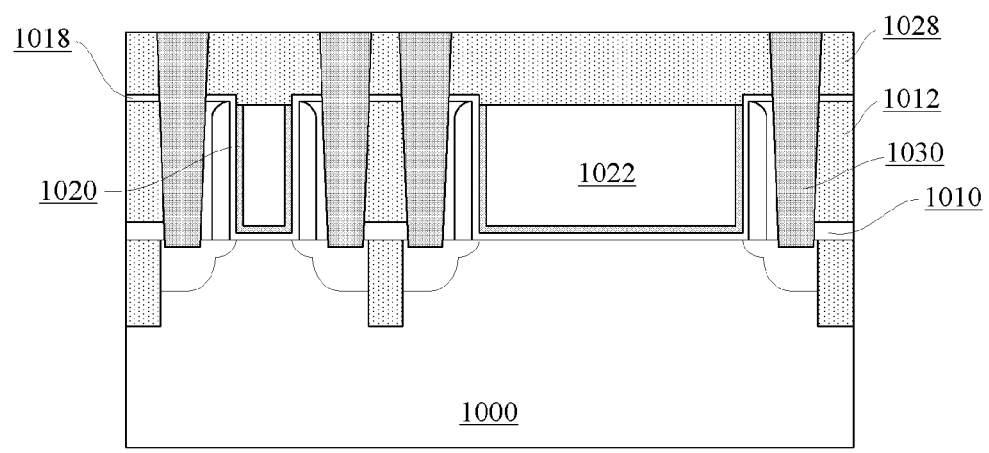
FIG. 14 is a cross sectional view during an intermediate step of a planarization process according to an embodiment of the disclosed technology.

FIG. 14 is a cross sectional view during an intermediate step of a planarization process according to an embodiment of the disclosed technology. Next, as shown in FIG. 14, subsequent processes may be performed to complete fabrication of the semi-conductor device. For example, another ILD layer 1028 may be formed by deposition on the structure as shown in FIG. 13. The ILD layer 1028 may also comprise oxide. The ILD layer 1028 may be planarized by, for example, CMP or sputtering. Then, contact holes may be formed at positions corresponding to the source/drain regions. The contact holes may extend into the source/drain regions from the surface of the ILD layer 1028. The contact holes may be filled with a conductive material such as W and Cu, so as to form contacts 1030. In order to increase contact between the contacts 1030 and the respective source/drain regions, a silicidation process may be performed after the contact holes are formed, so as to form metal silicide (not shown) on the source/drain regions, and then the contact holes may be filled with the conductive material.

Although a case where two gate stacks with different gate lengths are formed on the substrate has been described in the above embodiments, the disclosed technology is not limited thereto. For example, the disclosed technology is also applicable to a case where only a single gate stack is formed (reference may be made to the example as shown in FIGS. 8-9, in which although two gate stacks are shown, the gate stack on the left does not affect much the surface appearance of the gate conductor layer, which is thus similar to the case where only one single gate stack is formed), or a case where three or more gate stacks are formed. Further, the gate lengths of the gate stacks are not necessarily different, i.e., they may also be identical.

Furthermore, the operation of reducing the non-uniformity of the loading condition across the substrate is not limited to the above embodiments.

Figure 15:
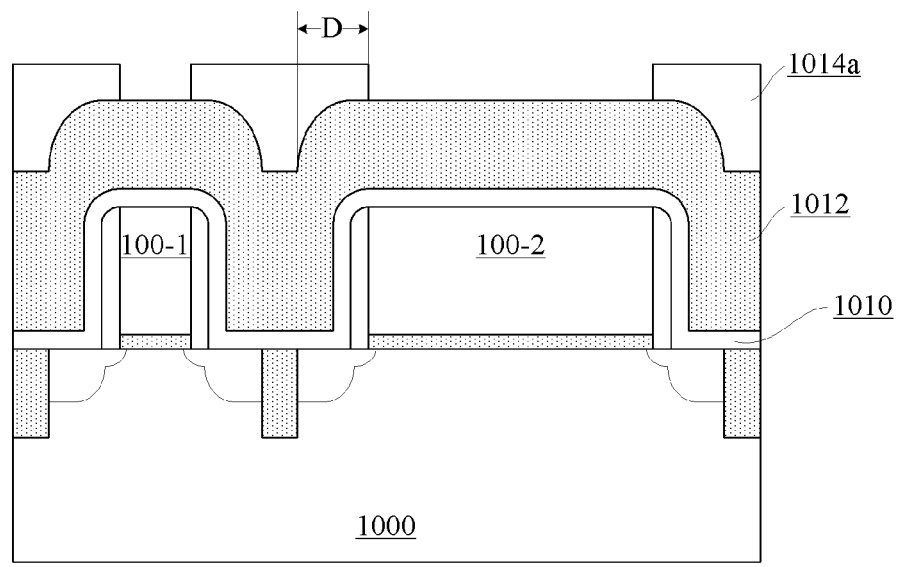
FIG. 15 is a cross sectional view, during an alternative intermediate step to the step illustrated in FIG. 3, of a planarization process according to an embodiment of the disclosed technology.

FIG. 15 is a cross sectional view, during an alternative intermediate step to the step illustrated in FIG. 3, of a planarization process according to an embodiment of the disclosed technology. For example, instead of the operation as shown in FIG. 3, photoresist 1014a may be coated on the ILD layer 1012, and then patterned by operations such as exposure via a mask and development, as shown in FIG. 15. Here, the photoresist 1014a may be patterned to expose the bulges (corresponding to the relatively high loading condition) of the ILD layer 1012 caused by the underlying features (specifically, the gate stacks 100-1, 100-2), so that these bulges may be at least partly removed in the subsequent patterning, and thus the loading condition may be reduced. For example, a mask for exposing the photoresist 1014a may be designed according to the mask for forming the gate stacks 100-1 and 100-2 (which determines locations, shapes or the like of the gate stacks 100-1 and 100-2, and thus partially determines fluctuations of the ILD layer 1012).

Figure 16:
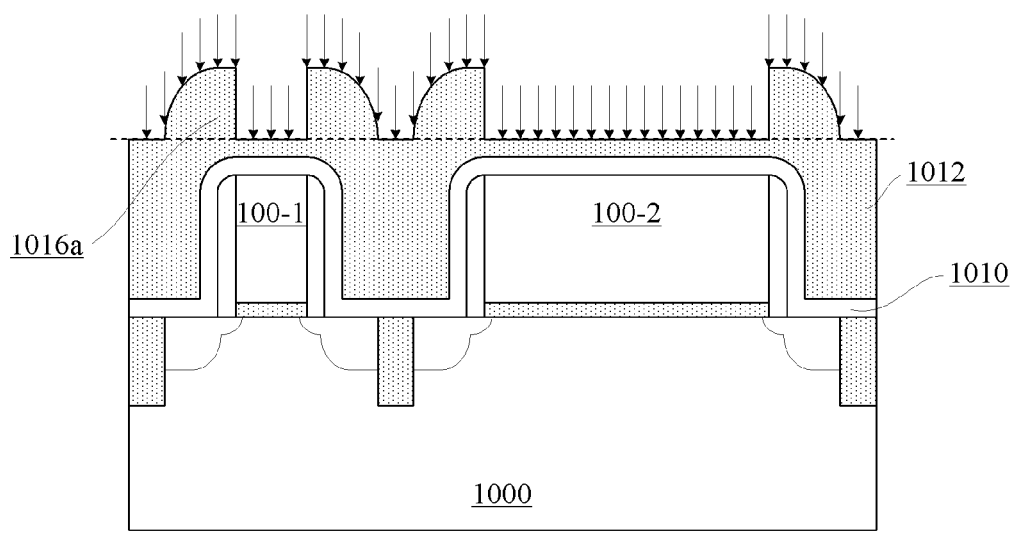
FIG. 16 is a cross section view, during an alternative intermediate step to the step illustrated in FIG. 5, of a planarization process according to an embodiment of the disclosed technology.

Patterning (for example, RIE) of the ILD layer 1012 with the photoresist 1014a patterned as such may result in protrusions 1016a (referring to FIG. 16). A width D of the protrusion 1016a substantially depends on overlay of the mask and the sidewall appearance of the bulges of the deposited ILD layer 1012. For example, D may be within a range of about 10-1000 nm due to process limitations.

FIG. 16 is a cross section view, during an alternative intermediate step to the step illustrated in FIG. 5, of a planarization process according to an embodiment of the disclosed technology. Then, instead of the above operation in FIG. 5, the ILD layer 1012 may be subjected to sputtering so as to be planarized, as shown in FIG. 16. The control conditions for the sputtering may be the same as those described above in conjunction with FIG. 5. Here, although there are still the protrusions 1016a, the loading condition above the gate stacks 100-1 and 100-2 can be significantly reduced as compared to the ILD layer 1012 before patterning, so as to be approximately comparable to the loading condition of most remaining portions of the ILD layer 1012. Therefore, the non-uniformity of the loading condition across the whole substrate can be reduced.

Figure 17:
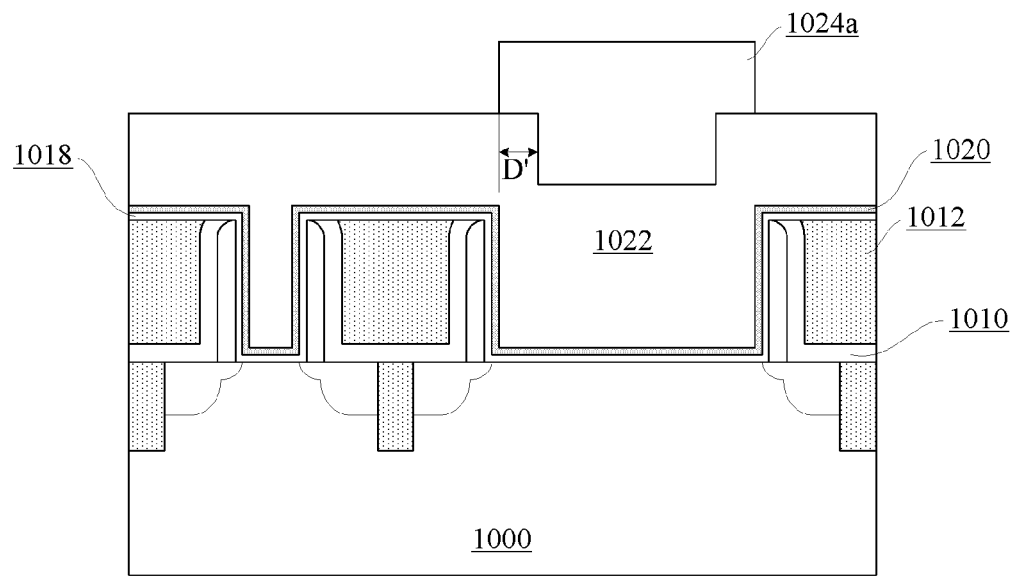
FIG. 17 is a cross section view, during an alternative intermediate step to the step illustrated in FIG. 9, of a planarization process according to an embodiment of the disclosed technology.

Similarly, instead of the above operation as shown in FIG. 9, photoresist 1024a may be coated on the gate conductor layer 1022, and then patterned by operations such as exposure via a mask and development, as shown in FIG. 17. Here, the photoresist 1024a may be patterned to shield the recess (corresponding to the relatively low loading condition) of the gate conductor layer 1022 caused by the underlying features (specifically, the gate trenches), so that a raised portion (relative to these recesses) outside these recesses may be at least partly removed in the subsequent patterning, in order to reduce the loading condition of the raised portion. For example, a mask for exposing the photoresist 1024a may be designed according to the mask for forming the gate stacks 100-1 and 100-2 (which determines locations, shapes or the like of the gate stacks 100-1 and 100-2 so as to determine the positions of the gate trenches, and thus partially determines the fluctuations of the gate conductor layer 1022).

FIG. 17 is a cross section view, during an alternative intermediate step to the step illustrated in FIG. 9, of a planarization process according to an embodiment of the disclosed technology. In the example of FIG. 17, the gate trench on the left is smaller (specifically in the gate length), like the example of FIG. 8. Therefore, there is no apparent recess in a portion of the gate conductor layer 1022 formed on this gate trench. Thus, it is also possible that the photoresist 1024a does not shield this portion of the gate conductor layer 1022.

Generally, when there is a recessed feature formed on the substrate and a material layer is deposited on this recessed feature, there is no apparent recess in the deposited material layer over the recessed feature, if the deposited material layer has a thickness greater than ½ of a width of the recessed feature.

Therefore, in designing the mask for exposing the photoresist 1024a according to the mask for forming the gate stacks 100-1 and 100-2, it is feasible to leave no photoresist at the position where the gate length is relatively short (for example, shorter than twice the thickness of the deposited gate conductor layer 1022).

Figure 18:
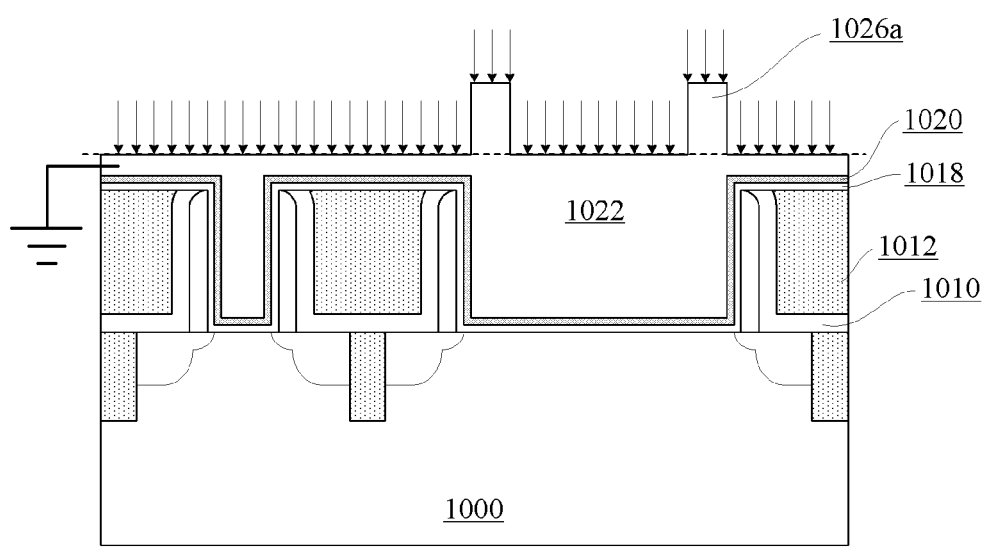
FIG. 18 is a cross section view, during an alternative intermediate step to the step illustrated in FIG. 11, of a planarization process according to an embodiment of the disclosed technology.

Patterning (for example, RIE) of the gate conductor layer 1022 with the photoresist 1024a patterned as such may result in a protrusion 1026a (referring to FIG. 18). A width D' of the protrusion 1026a substantially depends on overlay of the mask and the sidewall appearance of the recess of the deposited gate conductor layer 1022. For example, D' may be within a range of about 10-1000 nm due to process limitations. Generally, the smaller D' is, the better the result is.

FIG. 18 is a cross section view, during an alternative intermediate step to the step illustrated in FIG. 11, of a planarization process according to an embodiment of the disclosed technology. Then, instead of the above operation in FIG. 11, the gate conductor layer 1022 may be subjected to sputtering so as to be planarized, as shown in FIG. 18. The control conditions for the sputtering may be the same as those described above in conjunction with FIG. 11. Here, although there is till the protrusion 1026a, the loading condition above the gate trench (which is originally smaller due to the recess) has become approximately comparable to the loading condition of most remaining portions of the gate conductor layer, as compared to the gate conductor layer 1022 before patterning. Therefore, the non-uniformity of the loading condition across the whole substrate can be reduced.

Figure 19:
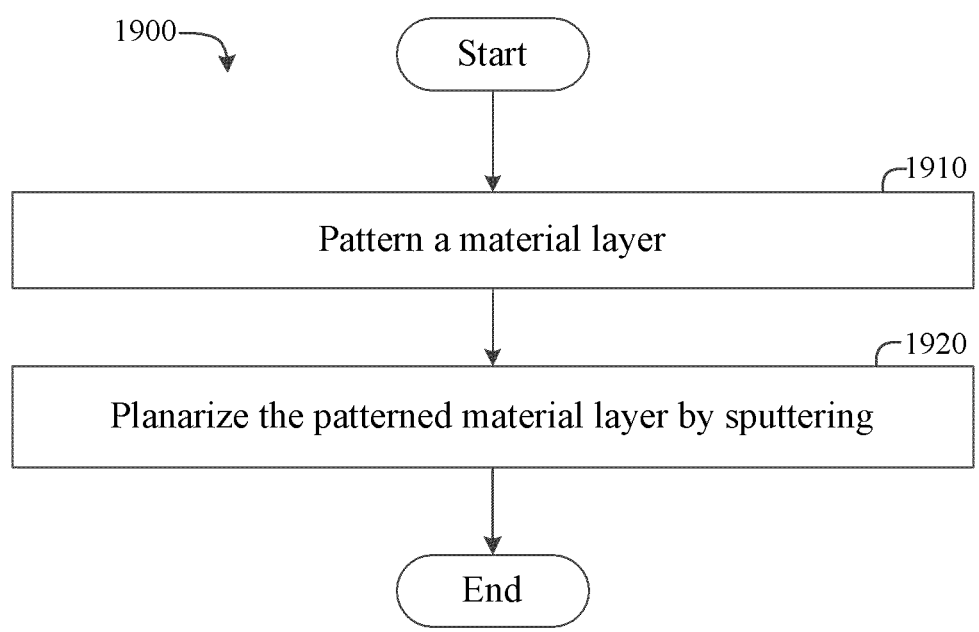
FIG. 19 is a flowchart illustrating an embodiment of a method of planarizing a material layer formed on a substrate according to an embodiment of the disclosed technology.

FIG. 19 is a flowchart illustrating an embodiment of a method 1900 of planarizing a material layer formed on a substrate according to an embodiment of the disclosed technology In block 1910, method 1900 patterns a material layer. The material layer may be formed on a substrate. The substrate may comprise a plurality of nonuniform (inconsistent) features formed thereon, and the material layer is formed on the substrate to cover the features. The material layer may cover features including raised gates, raised fins, and/or recessed gate trenches. The features may be of variable (inconsistent) widths, lengths, and heights or depths. In an embodiment, the material layer is patterned so that there are protrusions distributed in a substantially uniform manner on the patterned material layer.

In an embodiment, patterning the material layer includes coating photoresist on the material layer, patterning the photoresist with a first mask, and patterning the material layer with the patterned photoresist, wherein the design of the first mask for patterning the photoresist is based on a second mask for forming the features in such a manner that there are protrusions distributed in a substantially uniform way on the patterned material layer. In an embodiment, the material layer is patterned so that a portion of the material layer which has a relatively high loading condition is at least partly removed.

In an embodiment, patterning the material layer includes coating photoresist on the material layer, patterning the photoresist with a first mask, so as to expose at least a portion of a bulge on the material layer caused by the features, and/or to shield an recess on the material layer caused by the features, and patterning the material layer with the patterned photoresist, wherein the design of the first mask for patterning the photoresist is based on a second mask for forming the features.

In an embodiment, the features comprise a raised feature on the substrate, and the patterning of the material layer is stopped near the substantially lowest portion of a top surface of the material layer. In an embodiment, the features include a plurality of gates with nonuniform (inconsistent) gate lengths, and the patterning of the material layer is stopped at a height within a range of 50 nm above or below the substantially lowest portion of a top surface of the material layer. In an embodiment, the material layer comprises oxide, and is formed on the substrate via a nitride liner layer.

In an embodiment, the features comprise a recessed feature on the substrate, and the patterning of the material layer is stopped near the substantially lowest portion of a top surface of the material layer. In an embodiment, the feature comprises a plurality of gate trenches with nonuniform (inconsistent) gate lengths, and the method further comprises forming a gate dielectric layer and a gate conductor layer in the gate trenches, wherein the material layer comprises the gate conductor layer, and the patterning of the material layer is stopped approximately at a top surface of a portion of the gate conductor layer located at a middle of a relatively wide gate trench.

In block 1920, the method 1900 includes planarizing the patterned material layer by sputtering. In an embodiment, the patterning of the material layer results in (enables that) a loading condition for the sputtering on the material layer having a lower non-uniformity across the substrate than that before the patterning. In an embodiment, AR or N plasma is used for the sputtering. In an embodiment, after the sputtering, the method further includes performing a Chemical Mechanical Polishing process. In an embodiment, the material layer is grounded during the sputtering. In an embodiment, the material layer is continuous when the sputtering is ended.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

What is claimed is:

1. A method of planarizing a material layer formed on a substrate, comprising:
    patterning the material layer, wherein the patterning is stopped near a substantially lowest portion of a top surface of the material layer to leave some protrusions above the lowest portion of the top surface; and
    planarizing the patterned material layer by sputtering,
    wherein the, patterning of the material layer results in a loading condition for the sputtering on the material layer having a lower non-uniformity across the substrate than that before the patterning.

2. The method of claim 1, wherein the substrate comprises a plurality of nonuniform features formed thereon, and the material layer is formed on the substrate to cover the features.

3. The method of claim 2, wherein patterning the material layer comprises:
    coating photoresist on the material layer;
    patterning the photoresist with a first mask; and
    patterning the material layer with the patterned photoresist, wherein the design of the first mask for patterning the photoresist is based on a second mask for forming the features in such a manner that the protrusions are distributed in a substantially uniform way on the patterned material layer.

4. The method of claim 2, wherein patterning the material layer comprises:
    coating photoresist on the material layer;
    patterning the photoresist with a first mask, so as to expose at least a portion of a bulge on the material layer caused by the features, and/or to shield an recess on the material layer caused by the features; and
    patterning the material layer with the patterned photoresist, wherein the design of the first mask for patterning the photoresist is based on a second mask for forming the features.

5. The method of claim 2, wherein the features comprise a raised feature on the substrate.

6. The method of claim 2, wherein the features comprise a plurality of gates with nonuniform gate lengths, and the patterning of the material layer is stopped at a height within a range of 50nm above or below the substantially lowest portion of the top surface of the material layer.

7. The method of claim 6, wherein the material layer comprises oxide, and is formed on the substrate via a nitride liner layer.

8. The method of claim 2, wherein the features comprise a recessed feature on the substrate.

9. The method of claim 2, wherein the feature comprises a plurality of gate trenches with nonuniform gate lengths, and the method further comprises:
    forming a gate dielectric layer and a gate conductor layer in the gate trenches,
    wherein the material layer comprises the gate conductor layer, and the patterning of the material layer is stopped approximately at a top surface of a portion of the gate conductor layer located at a middle of a relatively wide gate trench.

10. The method of claim 9, wherein the material layer is grounded during the sputtering.

11. The method of claim 10, wherein the material layer is continuous when the sputtering is ended.

12. The method of claim 1, wherein the protrusions are distributed in a substantially uniform manner on the patterned material layer.

13. The method of claim 1, wherein the material layer is patterned so that a portion of the material layer which has a relatively high loading condition is at least partly removed.

14. The method of claim 1, wherein AR or N plasma is used for the sputtering.

15. The method of claim 1, further comprising performing a Chemical Mechanical Polishing process after the sputtering.

* * * * *